United States Patent

[11] 3,571,913

[72] Inventors George E. Bodway
Mountain View;
Sanehiko Kakihana, Los Altos, Calif.
[21] Appl. No. 754,049
[22] Filed Aug. 20, 1968
[45] Patented Mar. 23, 1971
[73] Assignee Hewlett-Packard Company
Palo Alto, Calif.

[54] METHOD OF MAKING OHMIC CONTACT TO A SHALLOW DIFFUSED TRANSISTOR
8 Claims, 7 Drawing Figs.

[52] U.S. Cl. .......... 29/571, 29/578, 29/590, 29/591
[51] Int. Cl. .......... B01j 17/00, H01g 13/00, H01l 11/14
[50] Field of Search .......... 156/17; 252/79.4; 29/578, 589, 590, 591, 571; 317/234/5.3

[56] References Cited
UNITED STATES PATENTS
3,370,207 2/1968 Fabel et al. .......... 317/234/503
3,431,636 3/1969 Granberry .......... 317/235/40.1
3,432,920 3/1969 Rosenzweig .......... 317/235/48.1
3,449,825 6/1969 Loro .......... 29/590X
3,480,841 11/1969 Castrucci et al. .......... 29/589X
3,481,030 12/1969 Velde et al .......... 29/571
3,484,796 12/1969 Schuller .......... 29/578

*Primary Examiner*—John F. Campbell
*Assistant Examiner*—Richard Bernard Lazarus
*Attorney*—Roland I. Griffin

ABSTRACT: An NPN microwave transistor is formed by diffusing a shallow P-type base region into an N-type collector region of a silicon-wafer and by diffusing an even more shallow N-type emitter region into the P-type base region. Platinum is alloyed to selected portions of the base region to form platinum silicide base subcontacts. Molybdenum and gold contacts are then formed on the platinum silicide base subcontacts and on the emitter region. These molybdenum and gold contacts are formed by successively depositing layers of molybdenum and gold on the wafer and by removing all but the desired contact portions of these layers with an etchant including ethylene glycol to reduce undercutting of the contacts during etching.

INVENTORS
GEORGE E. BODWAY
SANEHIKO KAKIHANA
BY Roland I. Griffin
ATTORNEY

METHOD OF MAKING OHMIC CONTACT TO A SHALLOW DIFFUSED TRANSISTOR

BACKGROUND AND SUMMARY OF THE INVENTION

This invention relates to a method of making ohmic contact to shallow-diffused, small-geometry transistors, such as double-diffused, NPN microwave transistors, and to an etchant that may be used in forming contacts by this method.

In a double-diffused, NPN microwave transistor the emitter region is diffused into the base region through an opening in an oxide masking layer on the semiconductor wafer in which the transistor is formed. The emitter region is typically diffused to a very shallow depth of only about 1,500 to 2,000 angstroms. One conventional method of making ohmic contact to such a shallow-diffused, small-geometry transistor comprises alloying platinum to the emitter region through the emitter diffusion opening in the oxide masking layer and to the base region through one or more base contact openings in the oxide masking layer. However, due to the small geometry of a double-diffused microwave transistor and the extremely shallow diffusion of its emitter region, the edge of the emitter diffusion opening in the oxide masking layer is so close to the emitter-base junction at the surface of the wafer that horizontal migration of the platinum silicide formed during the alloying process often shorts out the emitter-base junction. Moreover, unless the alloying process is very carefully controlled, vertical migration of the platinum silicide may also short out the emitter-base junction.

Another conventional method of making ohmic contact to a double-diffused, NPN microwave transistor comprises alloying aluminum to the base and emitter regions. However, in addition to the horizontal and vertical migration problems described above, aluminum reacts with the oxide masking layer typically used in the process of forming the ohmic contacts. Consequently, the likelihood of shorting out the emitter-base junction during the alloying process is even greater with aluminum than with platinum. Furthermore, it is difficult to make good ohmic contact to N-type silicon with aluminum.

Accordingly, it is the principal object of this invention to provide an improved and high yield method for making reliable ohmic contact to shallow-diffused, small-geometry semiconductor devices and, particularly, to double-diffused, NPN microwave transistors.

This object is accomplished as illustrated for a double-diffused, NPN microwave transistor by forming a comparatively thin oxide masking layer over the emitter diffusion opening in the oxide masking layer employed during formation of the N-type emitter region of the transistor. Base contact openings are then formed through the oxide masking layer (or layers) disposed over the P-type base region, and platinum is alloyed with the exposed portions of the P-type base region to form platinum silicide subcontacts. The thin oxide masking layer covering the emitter diffusion opening in the oxide masking layer prevents platinum silicide from forming in the emitter region and horizontally or vertically shorting out the emitter-base function. After the platinum silicide subcontacts have been formed, the thin oxide masking layer covering the emitter diffusion opening is removed. Comparatively thick molybdenum-gold contacts are then sputtered on the exposed N-type emitter region and on the platinum-silicide base subcontacts. As long as the emitter region is doped to a concentration of $10^{18}$/cc., or above, the molybdenum-gold contact sputtered thereon is very adherent and presents a low contact resistance of $10^{-4}$ ohm per centimeter squared, or less.

It is another object of this invention to provide an improved etchant that may be used in the above method to minimize undercutting beneath an etch-resistant masking layer during etching through openings in the masking layer. This object is accomplished according to the preferred embodiment of this invention by mixing a viscous, nonaqueous substance such as ethylene glycol with an etching agent for the material to be etched.

Other and incidental objects of this invention will become apparent from a reading of this specification and an inspection of the accompanying drawing.

DESCRIPTION OF THE PREFERRED EMBODIMENT

Figure 1:
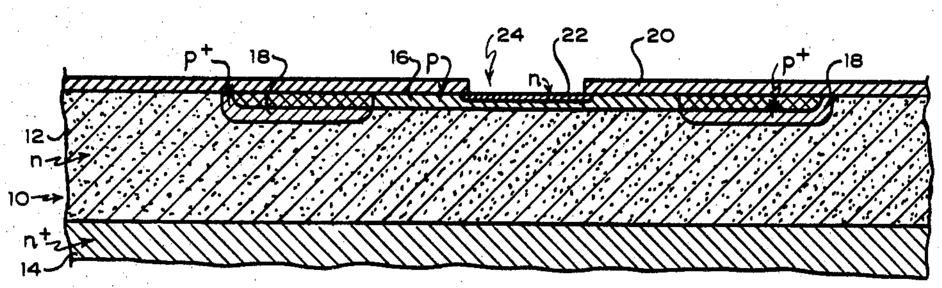
FIGS. 1—7 are fragmentary transverse sectional views illustrating the various steps of making ohmic contact to an NPN microwave transistor in accordance with the preferred embodiment of the method of this invention.

Referring to FIG. 1, there is shown a silicon wafer 10 from which an NPN microwave transistor is to be formed. This wafer includes an N-type epitaxial region 12 of about four microns in depth that serves as the collector of the transistor. It also includes a degenerately doped N+-type region 14 of about 4 and 7 mils in depth that adjoins N-type collector region 12 and serves as the collector contact region of the transistor. Collector region 12 is doped to a concentration of about $2 \times 10^{15}$/cc., and collector contact region 14 is doped to a concentration of about $10^{20}$/cc.

The base of the transistor is formed by covering wafer 10 with a first oxide masking layer and by diffusing, for example, a rectangular P-type region 16 of about 18 microns in width, 30 microns in length and 3,000 angstroms in depth into N-type collector region 12 through a corresponding opening in the first oxide masking layer. Base region 16 is doped to a concentration of about $10^{17}$/cc. Contact portions of base region 16 are formed by covering wafer 10 with a second oxide masking layer and by diffusing, for example, two rectangular, degenerately doped, P+-type regions 18 each of about 4 to 5 microns in width, 25 microns in length, and 6,000 angstroms in depth into P-type base region 16 and subjacent N-type collector region 12 through corresponding openings in the second oxide masking layer. These P+-type base contact regions 18 are doped to a concentration of about $10^{18}$/cc. and are arranged parallel to one another along the opposite lengthwise sides of P-type base region 16 (in the drawing the lengthwise sides of base region 18 run into and out of the plane of the paper). It may often be desirable to diffuse base contact regions 18 into collector region 12 prior to diffusion of the shallower base region 16.

The emitter of the transistor is formed by covering wafer 10 with a third oxide masking layer 20 of about 3,000 angstroms in depth and by diffusing, for example, a rectangular N-type region 22 of about 2½microns in width, 25 microns in length, and 1,500 angstroms in depth into P-type base region 16 through a corresponding opening 24 in the third oxide masking layer 20. This N-type emitter region 22 is doped to a concentration of about $10^{20}$/cc. and is arranged centrally between and longitudinally parallel to P+-type base contact regions 18.

Figure 2:
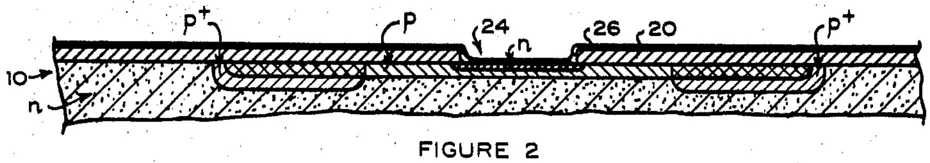

The base and emitter regions 16 and 22 of this microwave transistor are very small in size and shallow in depth compared to those of a typical low frequency transistor where the base and emitter regions have an area of more than 1 mil squared and a depth of from 1 to 3 microns. A method will now be described by which reliable ohmic contact may be made to the small, shallow base and emitter regions of this NPN microwave transistor on a large scale production basis with high yield. As indicated in FIG. 2, a comparatively thin oxide masking layer 26 of from about 50 to 200 angstroms in depth is initially grown on wafer 10 to cover the emitter diffusion opening 24 in oxide masking layer 20. An oxide masking layer 26 of about 100 angstroms in depth may be grown by heating wafer 10 in an atmosphere of dry oxygen at 850° centigrade for 2 minutes.

Figure 3:
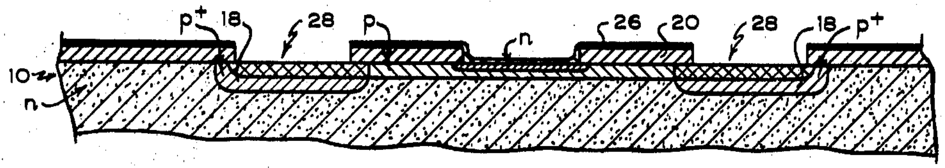
Figure 4:
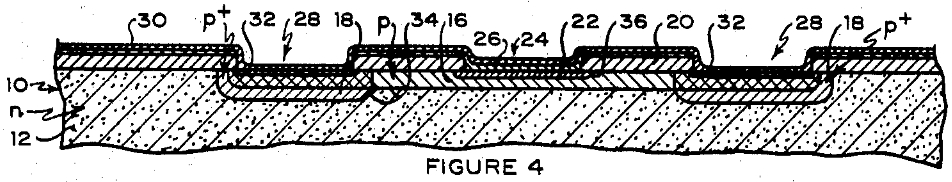

As indicated in FIG. 3, base contact openings 28 are etched through oxide masking layer 26 and subjacent oxide masking layer 20 t0 expose a rectangular area of about 2½microns in width and 25 microns in length within each P+-type base contact region 18. A layer 30 of an alloyable material such as platinum is then deposited to a depth of above 500 angstroms over wafer 10, as indicated in FIG. 4. This layer of platinum may best be deposited by triode sputtering for 5 minutes at an anode-to-collector voltage of about 4 kilovolts, a filament current of about ten amperes, and an argon pressure of about 3 microns. Either the conventional or the improved triode sputtering system described in George E. Bodway's copending patent application Ser. No. 702,284, filed on Feb. 1, 1968, and issued on Jun. 2, 1970, as U.S. Pat. No. 3,515,663 entitled "Triode Sputtering Apparatus Using An Electron Emitter" may be used to perform this triode sputtering step. Next, wafer 10 is heated in a dry nitrogen atmosphere at a temperature of about 600° centigrade for about 4 minutes to alloy platinum of layer 30 with the P+-type silicon base contact regions 18 exposed by openings 28 is oxide masking layers 20 and 26. This forms platinum silicide base subcontacts 32 through the base contact openings 28.

Due to the geometry of the transistor and the P+-type base contact regions 18, the platinum silicide base subcontacts 32 are formed far enough from collector and emitter regions 12 and 22 to prevent the collector-base junction 34 and the emitter-base junction 36 from being shorted out. Oxide masking layers 20 and 26 prevent platinum layer 30 from alloying with the rest of wafer 10. Specifically, the thin oxide masking layer 26 covering the emitter diffusion opening 24 in oxide masking layer 20 prevents platinum silicide from forming in the small shallow emitter region 22 where it might otherwise horizontally or vertically short out the emitter-base junction 36. Thus, the temperature and duration of this alloying step are not critical. For example, the temperature may vary from 500 to 700° centigrade, and the time may vary correspondingly from 1 hour to 2 minutes with 2 minutes actually being sufficient time even at the lower temperature. The noncriticality of this alloying step makes this method of making ohmic contact to small-geometry, shallow-diffused semiconductor devices vary practical for large scale production.

Figure 5:
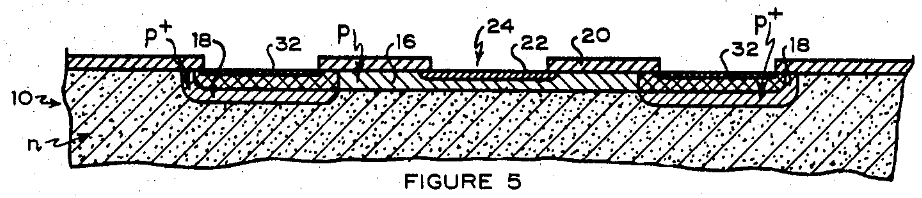

Referring to FIG. 5, platinum layer 30 is next etched away with an etchant, such as heated aqua regia, that does not etch platinum silicide. This enables the etching step to be performed within the necessity of employing a photoresist etching mask to protect the platinum silicide base subcontacts 32. The thin oxide masking layer 26 is then etched away to expose N-type emitter region 22 through the emitter diffusion opening 24 in oxide masking layer 20. This etching step may also be performed without the necessity of employing a photoresist etching mask to protect the platinum silicide base subcontacts 32 or the oxide masking layer 20 since conventional oxide etchants do not etch platinum silicide and since the thin oxide layer 26 is only about 100 angstroms in thickness, whereas the oxide masking layer 20 is about 3,000 angstroms in thickness. However, it should be performed as quickly as possible to minimize erosion of oxide masking layer 20 in the region of emitter diffusion opening 24. It may be accomplished, for example, in about 5 seconds using an agitated buffered etchant comprising a wetting powder, five parts of ammonium fluoride and one part of hydrofluoric acid.

Figure 6:
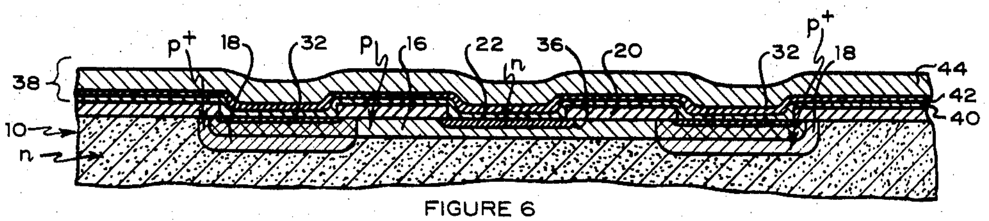

As indicated in FIG. 6, a multilayer stratum 38 of molybdenum and gold is next deposited over wafer 10 to a depth of about 4 to 8 thousand angstroms. This multilayer stratum 38 may best be deposited by successively triode sputtering a layer 40 of molybdenum about 500 to 1,000 angstroms in thickness, a mixed layer 42 of molybdenum and gold about 4 to 600 angstroms in thickness, and a layer 44 of gold about 4 to 6,000 angstroms in thickness onto wafer 10 in the same manner described in George E. Bodway's above-mentioned U.S. Pat. No. 3,515,663. The layer 40 of molybdenum prevents the gold of layers 42 and 44 from migrating into the N-type emitter region 22 and thereby horizontally or vertically shorting out the emitter-base junction 36.

Figure 7:
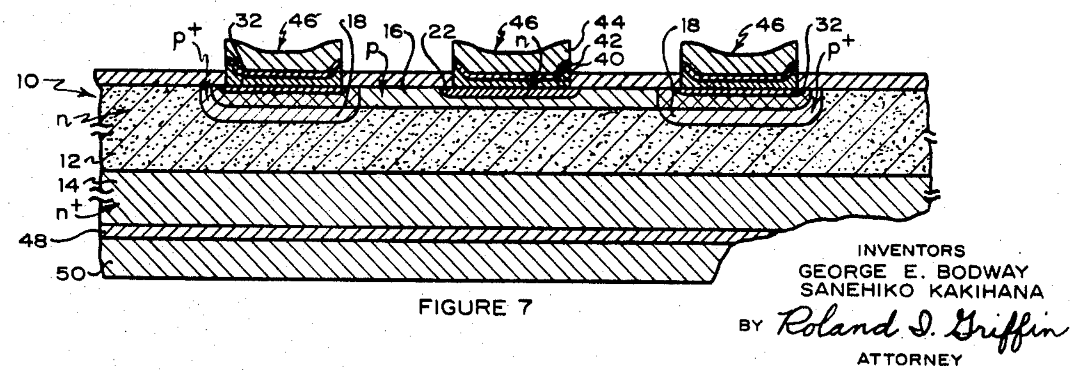

Multilayer stratum 38 is stable and adherent and makes very good contact to platinum silicide and to N-type silicon doped above $10^{18}$/cc. Reliable ohmic contacts 46 may therefore be made to the small, shallow base and emitter regions 16 and 22 of the NPN microwave transistor by covering the portions of multilayer stratum 38 that are vertically aligned with platinum silicide base subcontacts 32 and N-type emitter region 22 with an etch-resistant masking layer and by etching away the remaining portions of multilayer stratum 38 as indicated in FIG. 7. In accordance with the above-described method, these base and emitter contacts 46 are formed without the necessity of employing a critical alloying step during which the emitter base junction 36 might be shorted out.

As also indicated in FIG. 7, a collector contact for the microwave transistor may be formed by depositing a layer 48 of chromium about 1,000 angstroms in thickness on the *n*+-type collector contact region 14 and by depositing a layer 50 of gold about 6,000 angstroms in thickness on the layer 48 of chromium. These layers 48 and 50 of chromium and gold may also best be deposted by sputtering.

When conventional etchants are employed, for example, in the step of etch-forming base and emitter contacts 46 from stratum 38, there is typically as much, or more, lateral etching of the material beneath the etch-resistant masking layer as there is vertical etching through the openings in the etch-resistant masking layer. This lateral etching may severely undercut contacts 46 and thereby seriously weaken their overall adherency to wafer 10 and, in addition, degrade the RF performance of the transistor. Applicants have discovered that this lateral etching may be inhibited and even substantially prevented by employing an etchant including a nonaqueous substance with a viscosity greater than that of the desired etching agent and, typically, at least 7 to 10 centipoise or above at 20° centigrade. For example, an etchant may be employed in which from 30 to 60 percent by volume is ethylene glycol having a viscosity of about 20 centipoise at 20° centigrade, and the balance is the desired etching agent. Increasing the percentage of ethylene glycol decreases the etching rate, whereas decreasing the percentage of ethylene glycol increases the amount of lateral etching that may take place. The optimum etchant for the hold of layers 44 and 42 appears to comprise 50 percent ethylene glycol and 50 percent "C-35" (a conductor etchant produced by Film Microelectronics, Inc. of Burlington, Mass.) or some other such alkaline etching agent for gold. Similarly, the optimum etchant for the molybdenum of layers 42 and 40 appears to comprise 50 percent ethylene glycol and 50 percent "C-40X" (another conductor etchant produced by Film Microelectronics Inc.) or some other alkaline etching agent for molybdenum. For maximum effectiveness the improved etchant should be used within about 1 hour of the time it is prepared since reaction of the alkaline etching agent with the ethylene glycol begins to seriously impair the effectiveness of the etchant after about 1 hour. This period is considerably shorter when acid etching agents, such as aqua regia, are employed instead of alkaline etching agents.

We claim:

1. A method of making ohmic contact to different regions of a semiconductor wafer in which at least one of said regions is shallower and more heavily doped than another of said regions, said method comprising the steps of:
   - forming on said wafer a nonconductive masking layer substantially impervious to metal and completely covering said one of said regions;
   - alloying a first metal layer with an exposed portion of said wafer lying completely within said another of said regions to form an ohmic contact for said another of said regions;
   - removing a portion of said masking layer to expose a portion of said wafer lying completely within said one of said regions; and
   - depositing a second metal layer on the portion of said wafer exposed during said removing step to form an ohmic contact for said one of said regions.

2. A method as in claim 1 wherein:
   - said one of said regions is doped above $10^{18}$/cc.; and
   - said depositing step further comprises depositing said second metal layer on the ohmic contact formed during said alloying step.

3. A method as in claim 2 wherein:

said one of said regions and said another of said regions are contiguous with a junction therebetween and are of different conductivity type; and said forming step further comprises forming said masking layer on said wafer to completely overlap the junction between said one of said regions and said another of said regions.

4. A method as in claim 3 wherein:

said another of said regions is of p conductivity type and is diffused into said wafer;

said one of said regions is of n conductivity type and is diffused into said another of said regions through an opening in a first oxide layer comprising a portion of said masking layer; and said forming step further comprises forming on said wafer a second and thinner oxide layer completely covering said opening in said first oxide layer and comprising a second portion of said masking layer.

5. A method as in claim 4 including between said forming and alloying steps the additional steps of:

removing a portion of said first and second oxide layers to expose a portion of said wafer completely within said another of said regions; and depositing said first metal layer on said wafer in contact with the portion of said wafer exposed during said last-mentioned removing step.

6. A method as in claim 5 wherein:

said first-mentioned removing step comprises removing said second oxide layer to expose through said opening in the first oxide layer a portion of said wafer completely within said one of said regions; and said first-mentioned depositing step comprises sputtering said second metal layer on said wafer in contact with the portion of said wafer exposed during said first-mentioned removing step and in contact with the ohmic contact formed during said alloying step.

7. A method as in claim 6 wherein:

said first-mentioned depositing step comprises successively sputtering molybdenum and gold on said wafer to form said second metal layer;

said additional depositing step comprises sputtering platinum on said wafer to form said first metal layer; and said method includes the additional step of etching away at least some portions of said second metal layer to form the ohmic contacts for said one and said other of said regions.

8. A method as in claim 6 wherein said etching step is performed with an etchant including ethylene glycol.